(12) United States Patent
Barth, Jr. et al.

(10) Patent No.: US 7,668,003 B2
(45) Date of Patent: Feb. 23, 2010

(54) DYNAMIC RANDOM ACCESS MEMORY CIRCUIT, DESIGN STRUCTURE AND METHOD

(75) Inventors: John E. Barth, Jr., Williston, VT (US); Kangguo Cheng, Guilderland, NY (US); Hoki Kim, San Ramon, CA (US); Geng Wang, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/108,548

(22) Filed: Apr. 24, 2008

(65) Prior Publication Data

US 2009/0268510 A1  Oct. 29, 2009

(51) Int. Cl.
*G11C 11/24* (2006.01)
(52) U.S. Cl. .................................... 365/149; 365/210.1
(58) Field of Classification Search ................ 365/145, 365/149, 205, 210.1, 203
See application file for complete search history.

(56) References Cited

U.S. PATENT DOCUMENTS 4,700,329 A * 10/1987 Yamada et al. .............. 365/149
5,617,349 A * 4/1997 Koike .......................... 365/145
5,901,077 A * 5/1999 Nishimura .................. 365/145
6,914,840 B2   7/2005 Agata
2007/0242543 A1  10/2007 Romanovskyy et al.

* cited by examiner

*Primary Examiner*—Gene N. Auduong
(74) *Attorney, Agent, or Firm*—Gibb I.P. Law Firm, LLC; Michael J. LeStrange, Esq

(57) ABSTRACT

Disclosed is a DRAM circuit that incorporates an improved reference cell, has half the capacitance of the memory cell, does not require a particular reference voltage, and can be formed using the same fabrication processes as the memory cell. This DRAM circuit comprises a memory cell with a single trench capacitor and a reference cell having two trench capacitors. The two reference cell trench capacitors are connected in series through a merged buried capacitor plate such that they provide half the capacitance of the memory cell trench capacitor. Additionally, the reference cell trench capacitors have essentially the same structure as the memory cell trench capacitor so that they can be formed in conjunction with the memory cell trench capacitor. Also disclosed are a design structure for the above-described memory circuit and a method for forming the above-described memory circuit.

20 Claims, 10 Drawing Sheets

DYNAMIC RANDOM ACCESS MEMORY CIRCUIT, DESIGN STRUCTURE AND METHOD

BACKGROUND

1. Field of the Invention

The embodiments of the invention generally relate to dynamic random access memory (DRAM) circuits and, more particularly, to a DRAM circuit with a reference cell having two trench capacitors connected in series as well as a design structure for such a circuit and an associated method of forming such a circuit.

2. Description of the Related Art

Ground sensing or VDD sensing schemes of DRAM circuits (e.g., embedded DRAM (eDRAM) circuits) provide many advantages in improving memory performance. However, such sensing schemes require a unique reference cell for providing a reference voltage for sensing. A conventional reference cell in a DRAM circuit comprises two access transistors and a single capacitor. The capacitor in the reference cell is exactly the same as the capacitor in the memory cell. Therefore, in order to differentiate reference cell data from the memory cell data and provide a reference voltage, the reference cell requires a particular power supply voltage, VREF. VREF should provide a large amount of current and be very stable during high frequency operation. However, as the operation frequency of DRAM circuits and of eDRAM circuits in particular increases, it is becoming more and more difficult to provide a stable, high current, VREF to the reference cell capacitor. Consequently, using VREF as a sensing reference creates lot of noise and degrades sensing operation and memory performance. Therefore, there is a need in the art for a DRAM circuit reference cell that uses an alternative means for providing a sensing reference.

SUMMARY

In view of the foregoing, disclosed herein are embodiments of a DRAM circuit that incorporates an improved reference cell, which has half the capacitance of the memory cell, which does not require a particular reference voltage, and which can be formed using the same fabrication processes as the memory cell. Specifically, the DRAM circuit embodiments of the present invention comprise a memory cell with a single trench capacitor and further comprise a reference cell having two trench capacitors. The two reference cell trench capacitors are connected in series through a merged buried capacitor plate such that they provide half the capacitance of the memory cell trench capacitor. Additionally, the reference cell trench capacitors have essentially the same structure as the memory cell trench capacitor and, thus, can be formed in conjunction with the memory cell trench capacitor. Also disclosed herein are embodiments of a design structure for the above-described memory circuit and a method for forming the above-described memory circuit.

More particularly, disclosed herein are embodiments of a DRAM circuit that comprises a memory cell, a reference cell, a precharge circuit and a sense amplifier. The memory cell can comprise a memory cell capacitor that exhibits a first capacitance, whereas the reference cell can comprise two reference cell capacitors connected in series that exhibit a second capacitance. This second capacitance of the series connected reference cell capacitors can be approximately one half the first capacitance of the memory cell capacitor. To accomplish the capacitance difference between the memory cell capacitor and the series connected reference cell capacitors, the memory cell capacitor and the two reference cell capacitors can comprise substantially identical capacitor structures. For example, the memory cell capacitor and the two reference cell capacitors can comprise substantially identical trench capacitors. Each trench capacitor can comprise a trench extending vertically through a semiconductor layer, an insulator layer and into a semiconductor substrate. Each trench capacitor can further comprise a buried capacitor plate within the semiconductor substrate adjacent the trench, a capacitor dielectric layer lining the trench and, a additional capacitor plate on the capacitor dielectric layer within the trench.

The memory cell can further comprise a memory cell transistor comprising a first drain region electrically connected to a first bit line, a first gate electrically connected to a first word line, and a first source region electrically connected to the additional capacitor plate of the memory cell capacitor. Thus, the memory cell transistor is adapted to electrically connect the memory cell capacitor to the first bit line when the first word line is active. A first doped region within the semiconductor substrate and in contact with the buried capacitor plate of the memory cell capacitor and a first contact to this first doped region allow the buried capacitor plate of the memory cell capacitor to be electrically connected to ground.

The reference cell can further comprise a reference cell transistor comprising a second drain region electrically connected to a second bit line, a second gate electrically connected to a second word line, and a second source region electrically connected to the additional capacitor plate of a first reference cell capacitor. Thus, the reference cell transistor is adapted to electrically connect the two reference cell capacitors connected in series to the second bit line when the second word line is active. A second doped region in the semiconductor substrate and extending between the buried capacitor plates of the two reference cell capacitors electrically connects the two reference cell capacitors in series. A second contact to the additional capacitor plate of a second reference cell capacitor allows the two reference cell capacitors, which are connected in series, to further be electrically connected to a reference plate that can be charged to ground or VDD, as necessary.

Shallow trench isolation regions can be configured to electrically isolate the first source region of the memory cell transistor from all other features of the memory cell capacitor (i.e., from all memory cell capacitor features other than the additional capacitor plate) and further to electrically isolate the second source region of the reference cell transistor from all other features of the two reference cell capacitors connected in series (i.e., from all reference cell capacitor features other than the additional capacitor plate of the first one of the two reference cell capacitors).

The precharge circuit can be electrically connected to the first and second bit lines and can be adapted to precharge the first and second bit lines to a same voltage level (e.g., to a ground voltage level) when the first and second word lines are inactive. Finally, the sense amplifier can be electrically connected to the first and second bit lines and can be adapted to detect a potential difference between the first and second bit lines, when the first and second word lines are active so as to allow reading of data.

Also disclosed are embodiments of a method of forming the memory and reference cells to be incorporated into the above-described memory circuit. The method embodiments comprise providing a wafer having a semiconductor substrate, an insulator layer on the substrate and a semiconductor layer on the insulator layer. The method embodiments further comprise forming on the wafer a memory cell capacitor for the memory cell and two reference cell capacitors connected in series for the reference cell. The memory cell capacitor and reference cell capacitors are formed such that the memory cell capacitor and the two reference cell capacitors comprise substantially identical capacitor structures and further such that the memory cell capacitor exhibits a first capacitance and the two reference cell capacitors connected in series exhibit a second capacitance that is approximately one half the first capacitance.

The process of forming the memory cell capacitor and the reference cell capacitors comprises first forming trenches on the wafer through the semiconductor layer and the insulator layer into the semiconductor substrate. Next, buried capacitor plates are formed within the semiconductor substrate bordering the trenches (e.g., by performing a plasma doping process, a gas phase doping process, an ion implantation process, etc.). Then, capacitor dielectric layers are formed lining the trenches (e.g., by depositing one or more layers of an oxide material, a nitride material, an oxynitride material, and/or a high-k dielectric material). Once the capacitor dielectric layers are formed, additional capacitor plates are formed within the trenches on the capacitor dielectric layers (e.g., by depositing a polysilicon material).

After the trench capacitors for the memory cell capacitor and two reference cell capacitors are formed, first and second doped regions are formed in the substrate. Specifically, a first doped region is formed such that it is in contact with the buried capacitor plate of the memory cell capacitor and a second doped region is formed such that it extends between the buried capacitor plates of the two reference cell capacitors. The second doped region electrically connects the two reference cell capacitors in series.

Next, a memory cell transistor for the memory cell and a reference cell transistor for the reference cell in the semiconductor layer are formed such that a first source region of the memory cell transistor is in contact with the additional capacitor plate of the memory cell capacitor and such that a second source region of the reference cell transistor is in contact with the additional capacitor plate of one of the two reference cell capacitors.

Then, contacts are formed so as to allow electrical connections between a first drain region of the memory cell transistor and a first bit line, between a first gate of the memory cell transistor and a first word line, between the first doped region and ground, between a second drain region of the reference cell transistor and a second bit line, between a second gate of the reference cell transistor and a second word line and between an additional capacitor plate of another one of the two reference cell capacitors and a reference plate that can be charged to ground or VDD, as necessary.

Prior to forming the memory and reference cell transistors, shallow trench isolation regions can be formed in the semiconductor layer so that the subsequently formed first source region of the memory cell transistor will be electrically isolated from all other features of the memory cell capacitor (i.e., all features other than the additional capacitor plate of the memory cell capacitor) and such that the subsequently formed second source region of the reference cell transistor is electrically isolated from all other features of the two reference cell capacitors (i.e., all features other than the additional capacitor plate of the first one of the two reference cell capacitors).

Also disclosed are embodiments of a design structure embodied in a machine readable medium and comprising the memory circuit describe in detail above. This design structure can comprise a netlist and can reside on storage medium as a data format used for the exchange of layout data of integrated circuits.

These and other aspects of the embodiments of the invention will be better appreciated and understood when considered in conjunction with the following description and the accompanying drawings. It should be understood, however, that the following descriptions, while indicating the embodiments of the invention and numerous specific details thereof, are given by way of illustration and not of limitation. Many changes and modifications may be made within the scope of these embodiments without departing from the spirit thereof, and these embodiments include all such modifications.

BRIEF DESCRIPTION OF THE DRAWINGS

The embodiments of the invention will be better understood from the following detailed description with reference to the drawings, in which.

DETAILED DESCRIPTION OF EMBODIMENTS

Figure 1:
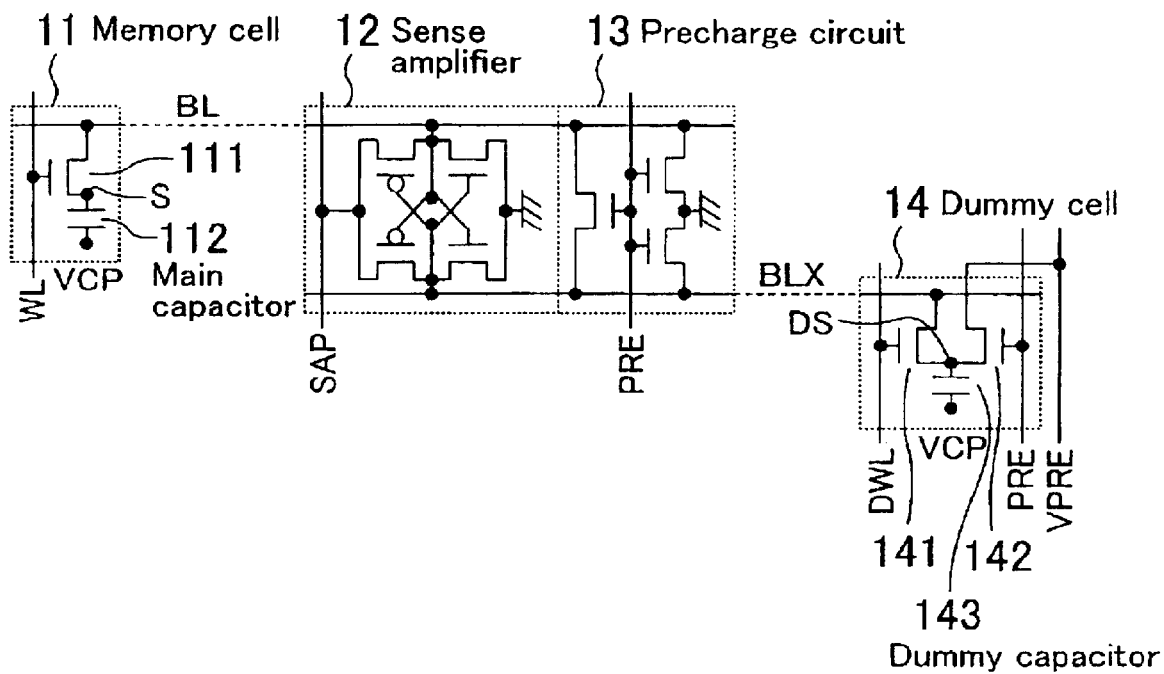
FIG. 1 is a schematic diagram illustrating a prior art DRAM circuit.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned above, ground sensing or VDD sensing schemes of DRAM circuits (e.g., embedded DRAM (eDRAM) circuits) provide many advantages in improving memory performance. However, such sensing schemes require a unique reference cell for providing a reference voltage for sensing. A conventional reference cell in a DRAM circuit comprises two access transistors and a single capacitor. The capacitor in the reference cell is exactly the same as the capacitor in the memory cell. Therefore, in order to differentiate reference cell data from the memory cell data and provide a reference voltage, the reference cell requires a particular power supply voltage, VREF. VREF should provide a large amount of current and be very stable during high frequency operation. However, as the operation frequency of DRAM circuits and of eDRAM circuits in particular increases, it is becoming more and more difficult to provide a stable, high current, VREF to the reference cell capacitor. Consequently, using VREF as a sensing reference creates lot of noise and degrades sensing operation and memory performance. Therefore, there is a need in the art for a DRAM circuit reference cell that uses an alternative means for providing a sensing reference. Therefore, there is a need in the art for a DRAM circuit reference cell that uses an alternative means for providing a sensing reference.

U.S. Pat. No. 6,914,840 issued to Agata on Jul. 5, 2005 and incorporated herein by reference discloses both NMOS and PMOS type DRAM circuits having a reference cell that is not tied to VREF. Specifically, the DRAM circuit in Agata comprises memory cell having a memory cell capacitor and a reference cell having a reference cell capacitor; however, the capacitance of the reference cell capacitor is approximately half that of the memory cell capacitor. For example, referring to FIG. 1, the NMOS-type DRAM circuit 10 of Agata (described in detail at col. 7, line 63-col. 8, line 38) "includes a memory cell 11, a CMOS sense amplifier 12, a precharge circuit 13, and a dummy cell 14. The memory cell 11 is at the intersection of a word line WL and a bit line BL. The CMOS sense amplifier 12 serves to sense and amplify a potential difference between the pair of bit lines BL and BLX. The precharge circuit 13 precharges the bit line pair BL and BLX. The dummy cell 14 is provided at the intersection of a dummy word line DWL and the bit line BLX. The memory cell 11 is a 1-transistor cell composed of an NMOS transistor 111 and a main capacitor 112. The NMOS transistor 111 is turned on by activating the word line WL while the bit line BL is inactive, thereby electrically connecting the main capacitor 112 to the bit line BL. The sense amplifier 12, which is activated by activation of a signal line SAP, detects a potential difference caused between the bit line pair BL and BLX, and puts one of the bit line pair BL and BLX to a power supply voltage VDD (the activation voltage of the signal line SAP), while putting the other to a GND level. The precharge circuit 13, which is activated by activating a signal line PRE when the word line WL and the dummy word line DWL are inactive, precharges the bit line pair BL and BLX to the GND level. The dummy cell 14 is composed of NMOS transistors 141 and 142 and a dummy capacitor 143. The NMOS transistor 141 is turned on by activation of the dummy word line DWL, whereby the dummy capacitor 143 is electrically connected with the bit line BLX. The NMOS transistor 142 is turned on by activating the precharge-signal-supplying signal line PRE when the dummy word line DWL is inactive, thereby electrically connecting the dummy capacitor 143 and a voltage line VPRE with each other. The voltage line VPRE supplies the power supply voltage VDD. In the DRAM 10 with the above-mentioned configuration, the dummy capacitor 143 is configured so as to have capacitance smaller than, preferably about half of, the capacitance of the main capacitor 112." To accomplish this half capacitance, Agata incorporates different structures for the memory cell 11 and dummy or reference cell 14 (e.g., HSG and non-HSG structures, respectively). Alternatively, Agata incorporates different structures for the memory cell capacitor 112 and the reference cell capacitor 143 (e.g., stack or trench and planar structures, respectively). Because the cells and/or cell capacitors in the DRAM circuit of Agata have different structures, they have the disadvantage of requiring additional fabrication processes.

In view of the foregoing, disclosed herein are embodiments of a DRAM circuit that incorporates an improved reference cell, which has half the capacitance of the memory cell, which does not require a particular reference voltage, and which can be formed using the same fabrication processes as the memory cell. Specifically, the DRAM circuit embodiments of the present invention comprise a memory cell with a single trench capacitor and further comprise a reference cell having two trench capacitors. The two reference cell trench capacitors are connected in series through a merged buried capacitor plate such that they provide half the capacitance of the memory cell trench capacitor. Additionally, the reference cell trench capacitors have essentially the same structure as the memory cell trench capacitor and, thus, can be formed in conjunction with the memory cell trench capacitor. Also disclosed herein are embodiments of a design structure for the above-described memory circuit and a method for forming the above-described memory circuit.

Figure 2:
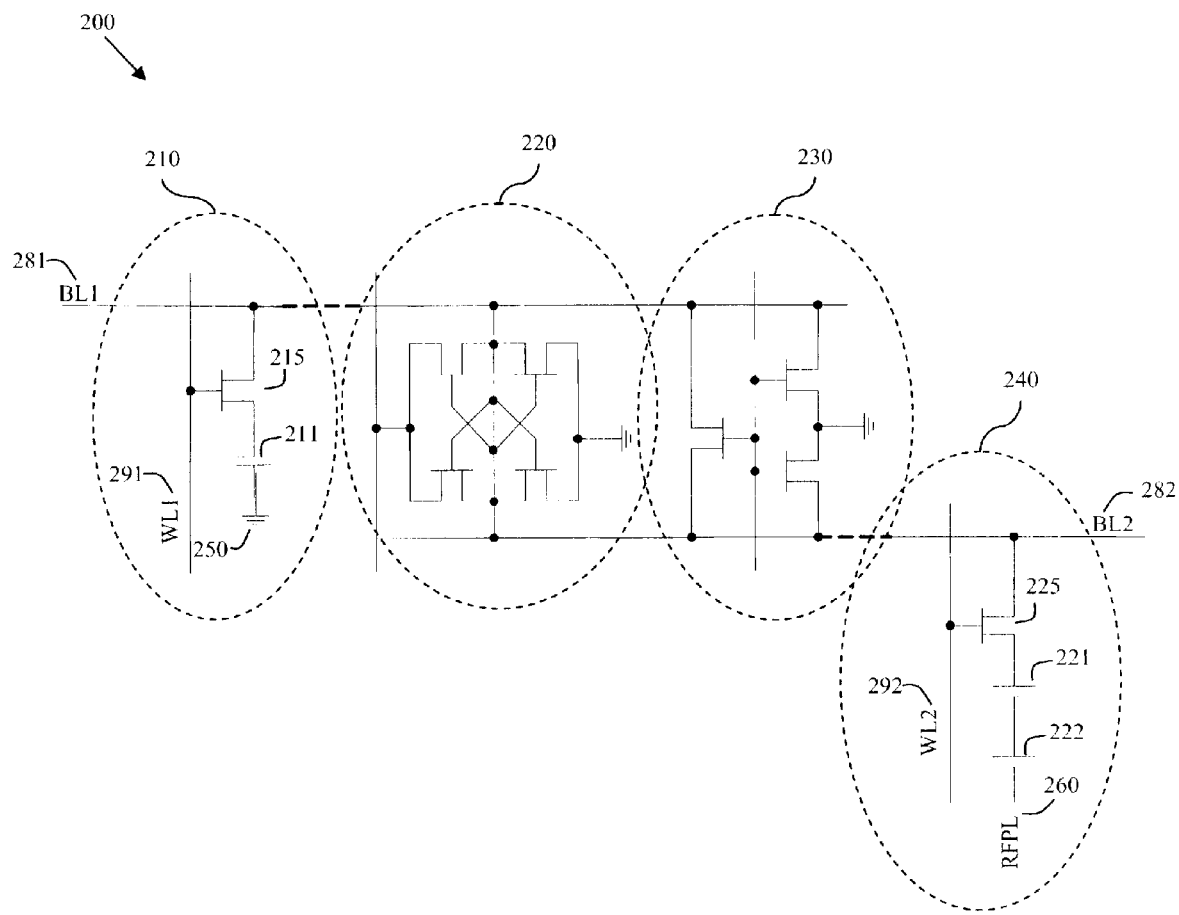
FIG. 2 is a schematic diagram illustrating an embodiment of the DRAM circuit of the present invention.

More particularly, referring to the schematic diagram of FIG. 2, disclosed herein are embodiments of a DRAM circuit 200 that, as with prior art DRAM circuits, comprises a memory cell 210, a reference cell 220, a precharge circuit 230 and a sense amplifier 220. However, in the case of the present invention, the memory cell 210 can comprise a memory cell capacitor 211 that exhibits a first capacitance, whereas the reference cell 220 can comprise two reference cell capacitors 221, 222 connected in series that exhibit a second capacitance which is different from the first capacitance. This second capacitance of the series connected reference cell capacitors 221-222 can be approximately one half the first capacitance of the memory cell capacitor 211. To accomplish the capacitance difference between the memory cell capacitor 211 and the series connected reference cell capacitors 221-222, the memory cell capacitor 211 and the two reference cell capacitors 221-222 can comprise substantially identical capacitor structures.

Figure 3:
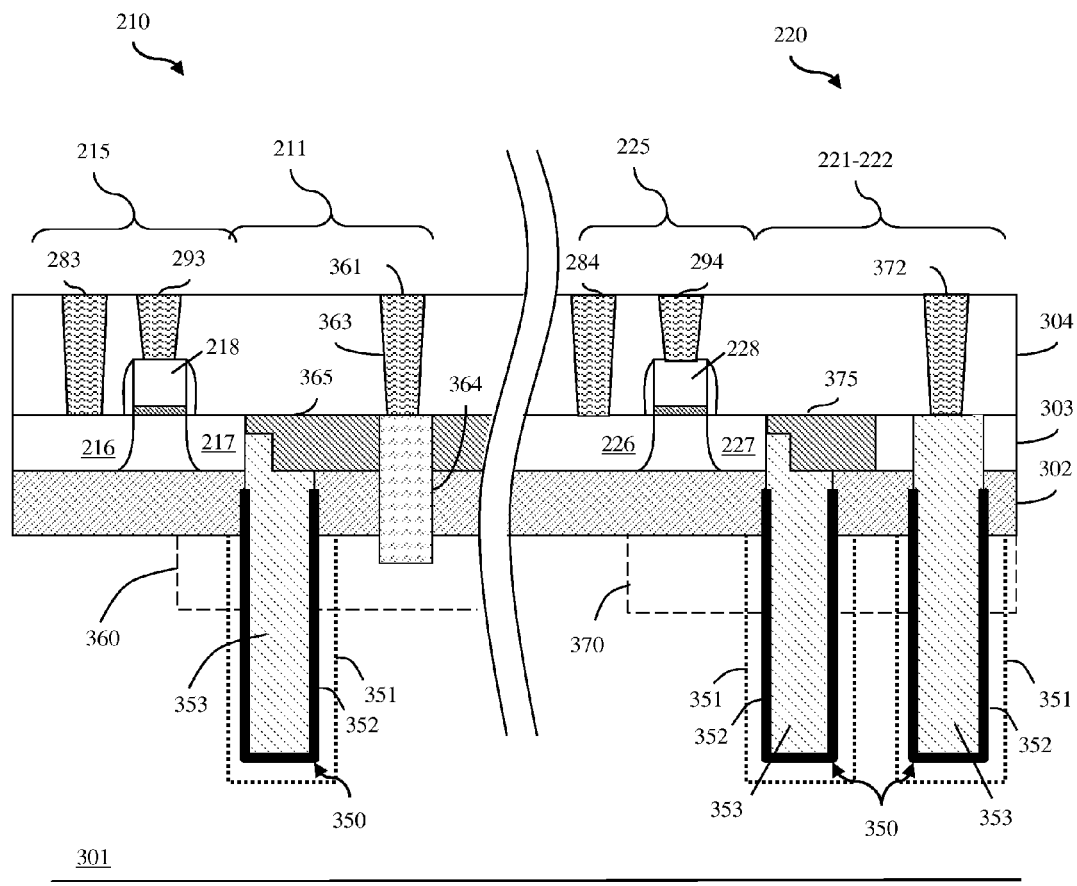
FIG. 3 is a cross-section diagram illustrating exemplary memory and reference cells that can be incorporated into the DRAM circuit of FIG. 2.

For example, referring to FIG. 2 in combination with the cross-section diagram of FIG. 3, the memory cell capacitor 211 and the two reference cell capacitors 221-222 can comprise substantially identical trench capacitors built on a wafer. The wafer can, for example, comprise a silicon-on-insulator (SOI) wafer comprising a semiconductor substrate 301 (e.g., a p-type silicon substrate), an insulator layer 302 (e.g., a buried oxide layer) on the semiconductor substrate 301, and a semiconductor layer 303 (e.g., a silicon layer) on the insulator layer 302. Each trench capacitor 211, 221, 222 can comprise a deep trench 350 extending vertically through the semiconductor layer 303 and insulator layer 302 into the semiconductor substrate 301. Each trench capacitor 211, 221, 222 can further comprise a buried capacitor plate 351 (i.e., a first electrode) immediately adjacent to (i.e., bordering) the trench 350 within the substrate 301. This buried capacitor plate 351 can, for example, comprise a region of the semiconductor substrate 301 that is heavily doped with an N-type dopant, such as phosphorous (P), antimony (Sb) or arsenic (As). Each trench capacitor 211, 221, 222 can also comprise a capacitor dielectric layer 352 lining the trench 350. This capacitor dielectric layer 352 can, for example, comprise a conformal layer of a dielectric material, such as an oxide, a nitride, an oxynitride, a high-k dielectric, etc. or any suitable combination thereof. Finally, each trench capacitor 211, 221, 222 can comprise an additional capacitor plate 353 (i.e., a second electrode) that is positioned on the capacitor dielectric layer 352 and fills the remaining portion of the trench 350. The additional capacitor plate 353 can comprise a conductor. For example, this additional capacitor plate 353 can comprise a deposited polysilicon material that is either in-situ doped or implanted with the same or a different N-type dopant as the buried capacitor plate 351.

The memory cell 210 can further comprise a memory cell transistor 215 comprising a first drain region 216 electrically connected to a first bit line 281 (e.g., via a first bit line contact 283), a first gate 218 electrically connected to a first word line 291 (e.g., via a first word line contact 293), and a first source region 217 electrically connected to (e.g., in direct contact with) the additional capacitor plate 353 of the memory cell capacitor 211. Thus, the memory cell transistor 215 is adapted to electrically connect the memory cell capacitor 211 to the first bit line 281 when the first word line 291 is active. A first doped region 360 can further be positioned within the semiconductor substrate 301 and in contact with the buried capacitor plate 350 of the memory cell capacitor 211. This first doped region 360 can, for example, comprise a band region at the top surface of the substrate 301. The band region can be heavily doped with the same or a different N-type dopant as the buried capacitor plate 351 of the memory cell capacitor 211. Additionally, a first contact 361 can extend to this first doped region 360. This first contact 361 can, for example, comprise an upper portion 363 and a lower portion 364 below the upper portion 363. The upper portion 363 of the contact 361 can be formed as a conductor-filled via through the interlayer dielectric 304 using conventional contact formation techniques. The lower portion 364 can, for example comprise a in-situ doped or implanted polysilicon-filled trench that extends from the upper portion 363 through the insulator layer 302 to the semiconductor substrate 301. This contact 361 to the first doped region 360 allows the buried capacitor plate 351 of the memory cell capacitor 211 to be electrically connected to ground 250.

The reference cell 220 can further comprise a reference cell transistor 225 comprising a second drain region 226 electrically connected to a second bit line 282 (e.g., via a second bit line contact 284), a second gate 228 electrically connected to a second word line 292 (e.g., via a second word line contact 294), and a second source region 227 electrically connected to (e.g., in direct contact with) the additional capacitor plate 353 of one of the two reference cell capacitors (i.e., first reference cell capacitor 221). Thus, the reference cell transistor 225 is adapted to electrically connect the two reference cell capacitors 221-222 connected in series to the second bit line 282 when the second word line 292 is active. A second doped region 370 in the semiconductor substrate 301 and extending between and electrically merging the buried capacitor plates 351 of the two reference cell capacitors 221-222 electrically connects the two reference cell capacitors 221-222 in series. This second doped region 370 can, for example, comprise a band region at the top surface of the substrate 301, which is heavily doped with the same or a different N-type dopant as the buried capacitor plates 351 of the reference cell capacitors 221-222. A second contact 372 to the additional capacitor plate 353 of the second reference cell capacitor 222 allows the two reference cell capacitors 221-222, which are connected in series, to further be electrically connected to reference Plate (RFPL) 260 (see FIG. 2). RFPL 260 is pre-charged to same potential as BL (e.g., ground in FIG. 2), while WL2 292 is pre-charged to the WL high level, writing a '0' to the reference cell. Upon activation, RFPL 260 swings from ground to Vdd when WL1 291 is activated, this transfers ½ the charge of a stored '1', reliably creating a reference level on BL2 half way between a stored '0' and a stored '1'. It should also be noted that WL2 292 remains at the WL high level for the entire cycle.

Shallow trench isolation (STI) region 365 can be configured to electrically isolate the first source region 217 of the memory cell transistor 215 from all other features of the memory cell capacitor 211 (i.e., from all memory cell capacitor features other than the additional capacitor plate). Specifically, the STI region 365 can be patterned and formed, using conventional processing techniques, so that within the semiconductor layer 303 one side of the additional capacitor layer 353 of the memory cell capacitor 211 is in contact with the first source region 217 of the memory cell transistor 215 and so that the top surface and opposite side of the additional capacitor layer 353 of the memory cell capacitor 211 are bordered by trench isolation material. It should be noted that the lower portion 364 of the first contact 361 can extend through the STI region 365 (as shown) or can be positioned on the opposite side of the STI region 365 from the first source region 217. Thus, the first source region 217 of the memory cell transistor 215 and the additional capacitor plate 353 of the memory cell capacitor 211 are electrically isolated from the first contact 361 and, thereby from ground.

Similarly, STI region 375 can be configured to electrically isolate the second source region 227 of the reference cell transistor 225 from all other features of the two reference cell capacitors 221-222 connected in series (i.e., from all reference cell capacitor features other than the additional capacitor plate 353 of the first reference cell capacitor 221). Specifically, the STI region 375 can be patterned and formed, using conventional processing techniques, so that within the semiconductor layer 303 one side of the additional capacitor layer 353 of the first reference cell capacitor 221 is in contact with the second source region 227 of the reference cell transistor 225 and the top surface and opposite side of the additional capacitor layer 353 of the first reference cell capacitor 221 are bordered by trench isolation material. It should be noted that the additional capacitor plate 353 of the second reference cell capacitor 222 can extend vertically to the top surface of the semiconductor layer 303, where it is electrically connected by the second contact 372 to a reference plate, which is charged to ground or VDD, as necessary. It should further be noted that the STI region 375 is positioned within the semiconductor layer 303 between the additional capacitor layers 353 of the first and second reference cell capacitors 221-222. Thus, the second source region 227 of the reference cell transistor 225 and the additional capacitor layer 353 of the first reference cell capacitor 221 are electrically isolated from the second contact 372 and, thereby from the reference plate.

Item 230 of FIG. 2 illustrates an exemplary precharge circuit 230 configuration that can be incorporated into the present invention. This pre-charge circuit 230 can be electrically connected to the first and second bit lines 281 and 282 and can be adapted to precharge the first and second bit lines 281-282 to a same voltage level and, as illustrated in this case, to a ground voltage level. RFPL 260 is also precharged to ground voltage level. WL1 291 stays inactive and WL2 292 is activated to write a 0 in the reference cell 220. Once the bit lines 281-281 are precharged, the precharge circuit 230 is turned off.

Item 240 of FIG. 2 illustrates an exemplary sense amplifier 240 configuration that can be incorporated into the present invention. The sense amplifier 240 typically comprises a pair of cross-connected inverters electrically connected between the first and second bit lines 281-282 and adapted to detect a potential difference between the first and second bit lines 281-281. During a read operation, activation of WL1 291 triggers RFPL 260 to swing from GND to VDD, transferring ½ charge of a stored one to BL2 282 and creating a reliable reference level which allows the sense amplifier to read the data.

While the above-discussion and accompanying illustrations indicate an embodiment in which the precharged circuit 230 precharges the memory cell capacitor 211 and two reference cell capacitors 221-222 to the same ground voltage level, it should be noted that alternative voltage levels can be used. For example, alternatively, the precharge circuit 230 can be adapted to precharge the memory cell capacitor 211 and two reference cell capacitors 221-222 to the same power supply voltage (VDD), when the first and second word lines 291-292 are active.

Figure 4:
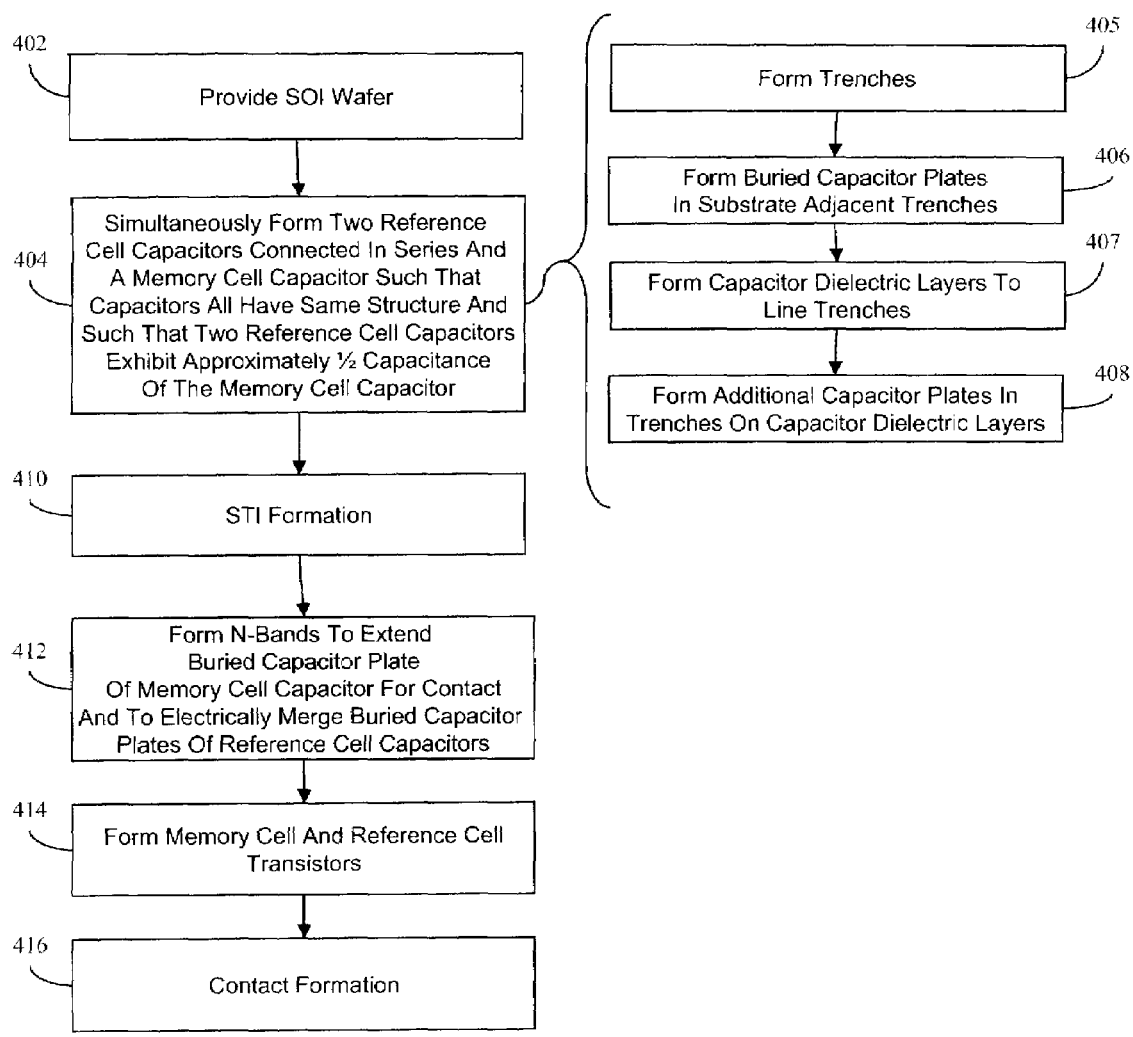
FIG. 4 is a flow diagram illustrating an embodiment of a method of forming the memory and reference cells of FIG. 3 for incorporation into the DRAM circuit of FIG. 2.

Referring to the flow diagram of FIG. 4, also disclosed are embodiments of a method of simultaneously forming the memory and reference cells to be incorporated into the above-described memory circuit.

Figure 5:
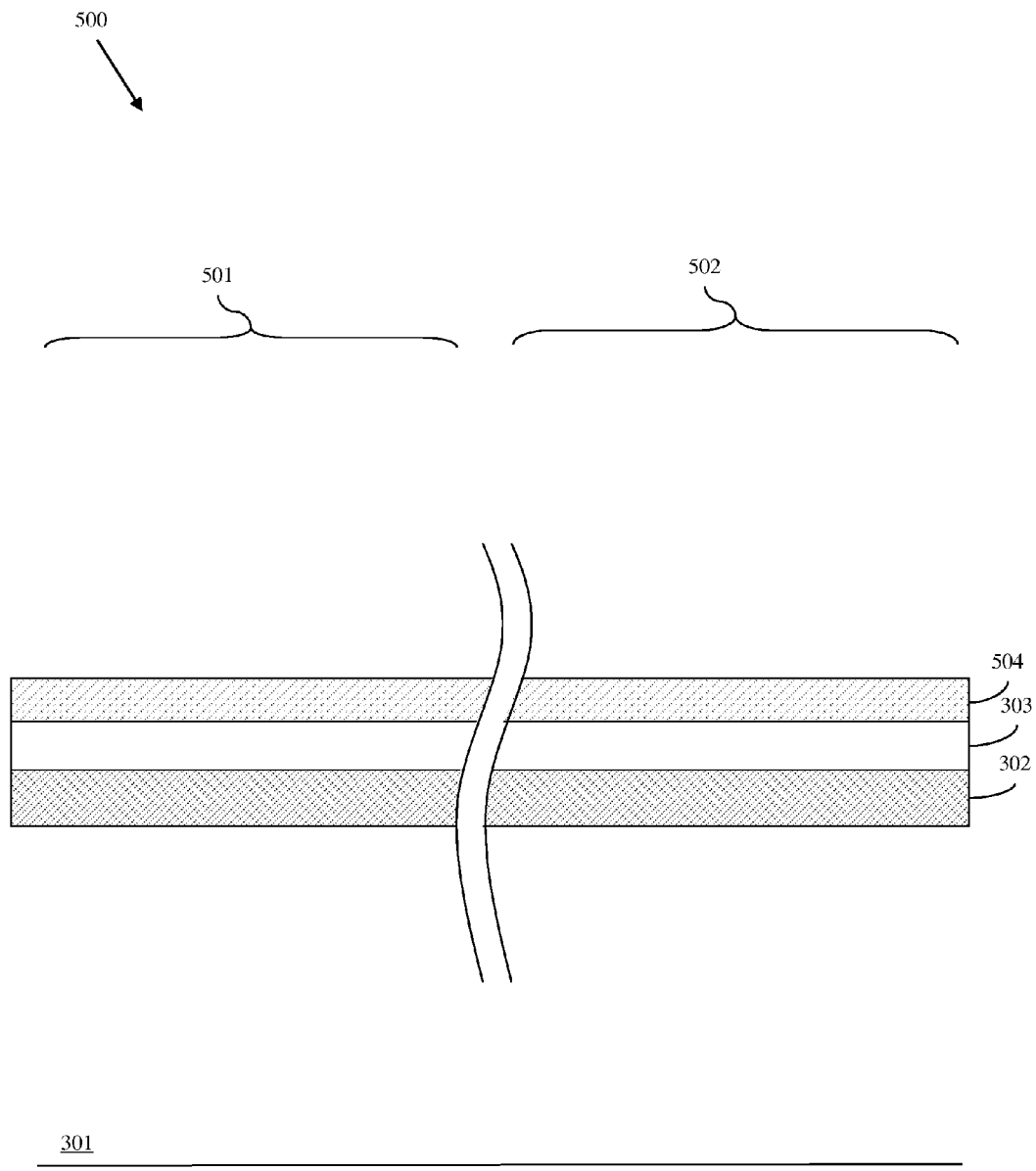
FIG. 5 is a cross-section diagram illustrating partially memory and reference cells formed according to the method of FIG. 4.

The method embodiments comprise providing a wafer 500 (402). This wafer 500 can, for example, comprise a silicon-on-insulator (SOI) wafer comprising a semiconductor substrate 301 (e.g., a p-type silicon substrate), an insulator layer 302 (e.g., a buried oxide layer) on the semiconductor substrate 301, and a semiconductor layer 303 (e.g., a silicon layer) on the insulator layer 302 (see FIG. 5). Additionally, a pad layer (e.g., a pad oxide and/or pad nitride layer) can be formed above the semiconductor layer 301 and sections 501, 502 of the wafer 500 can be designated for memory cell and reference cell formation, respectively.

The method embodiments further comprise forming on the wafer a memory cell capacitor for the memory cell and two reference cell capacitors connected in series for the reference cell (404). The memory cell capacitor and reference cell capacitors are formed such that the memory cell capacitor and the two reference cell capacitors comprise substantially identical capacitor structures and further such that the memory cell capacitor exhibits a first capacitance and the two reference cell capacitors connected in series exhibit a second capacitance that is approximately one half the first capacitance.

Figure 6:
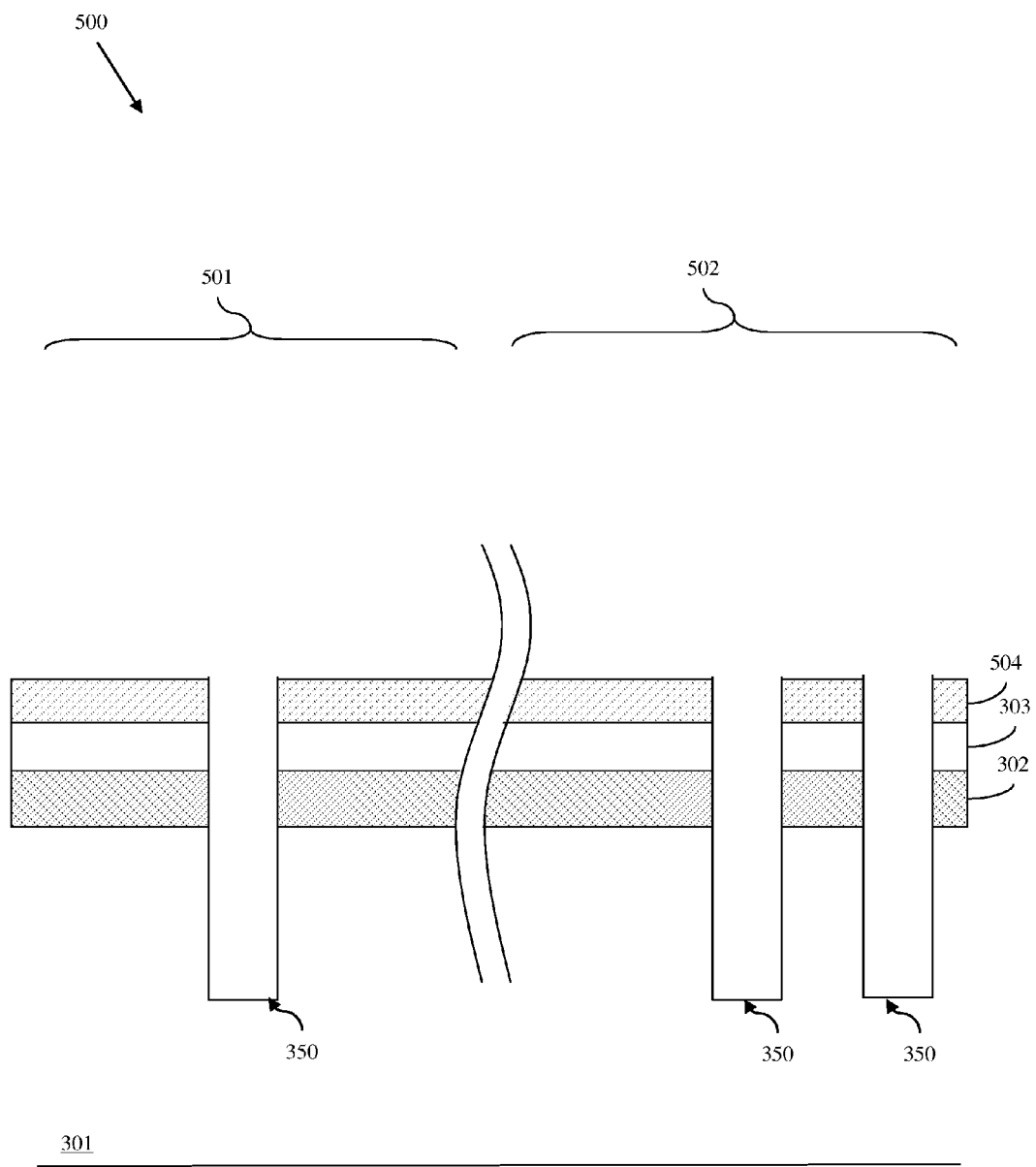
FIG. 6 is a cross-section diagram illustrating partially memory and reference cells formed according to the method of FIG. 4.
Figure 7:
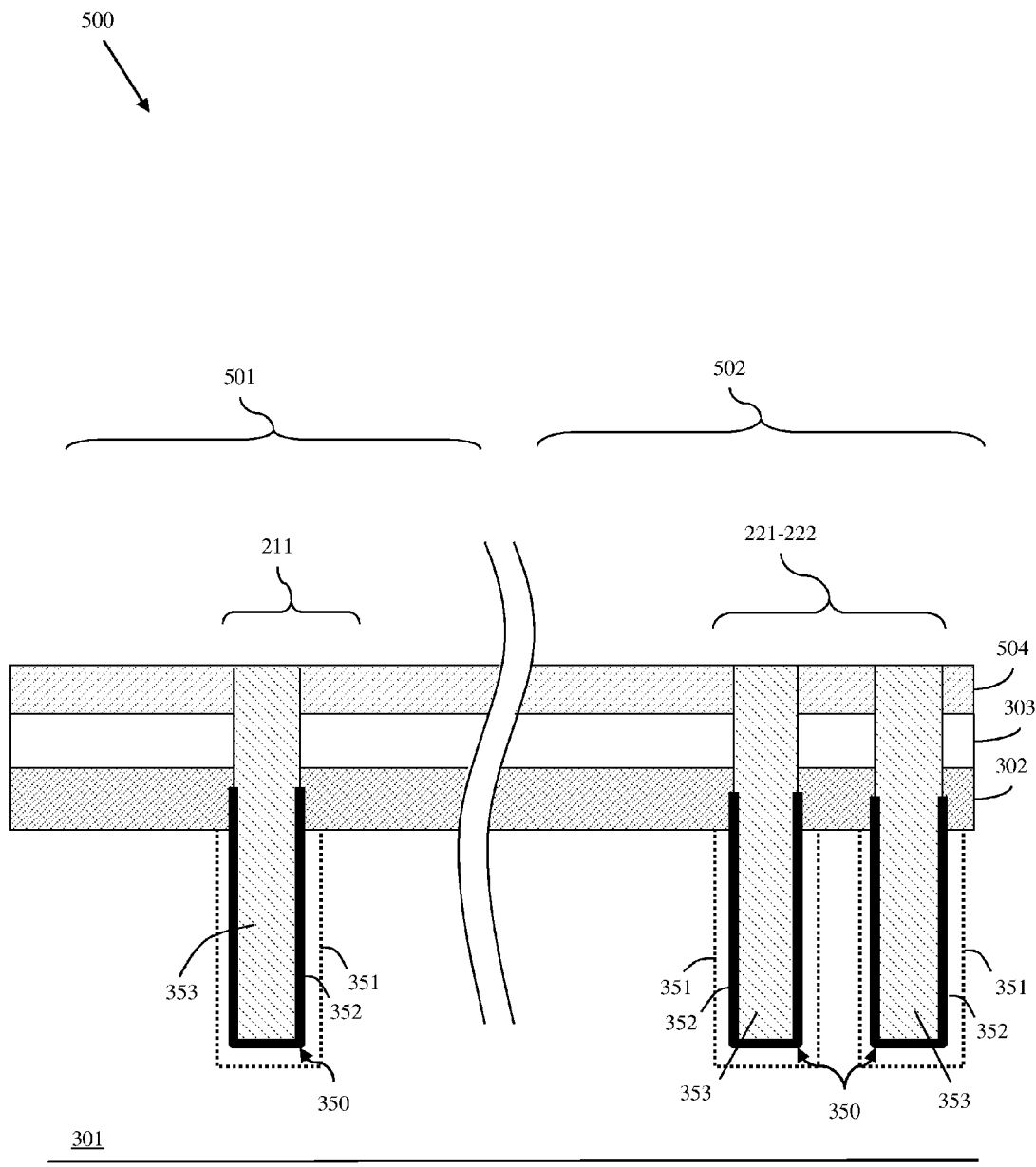
FIG. 7 is a cross-section diagram illustrating partially memory and reference cells formed according to the method of FIG. 4.

The process of forming the memory cell capacitor and the reference cell capacitors comprises first forming deep trenches 350 on the wafer 500 through the pad layer 504, the semiconductor layer 303 and the insulator layer 302 into the semiconductor substrate 301 (405, see FIG. 6). The process of forming the trenches 350 can, for example, be accomplished using conventional lithographic patterning and etch processes such that a single trench is formed in the section 501 designated for memory cell formation and two trenches are formed in the section 502 designated for reference cell formation. Next, buried capacitor plates 351 (i.e., a first electrode for each trench capacitor) are formed within the semiconductor substrate 301 bordering the trenches 350 (407, see FIG. 7). Such buried capacitor plates 351 can, for example, be formed by performing a plasma doping process, a gas phase doping process, an ion implantation process, etc. such that the resulting buried capacitor plates 351 comprise a region of the semiconductor substrate 301 that is heavily doped with an N-type dopant, such as phosphorous (P), antimony (Sb) or arsenic (As). Then, capacitor dielectric layers 352 are formed lining the trenches 350 (408, see FIG. 7). Such capacitor dielectric layers 352 can, for example, be formed by depositing (e.g., by chemical vapor deposition (CVP) or plasma vapor deposition (PVD)) one or more conformal layers of an oxide material, a nitride material, an oxynitride material, and/or a high-k dielectric material. Once the capacitor dielectric layers 352 are formed, additional capacitor plates 353 (i.e., second electrodes for each capacitor) are formed within the trenches 350 on the capacitor dielectric layers 352 (409, see FIG. 7). The additional capacitor plates 353 can be formed by filling the trenches 350 with a conductor. For example, a polysilicon material can be deposited into the trenches and either in-situ doped or subsequently implanted with the same or a different N-type dopant as the buried capacitor plates 351. Thus, memory cell capacitor 211 is formed in the first section 501 of the wafer 500 and two reference cell capacitors 221, 222 are formed in the second section 502 of the wafer 500.

Figure 8:
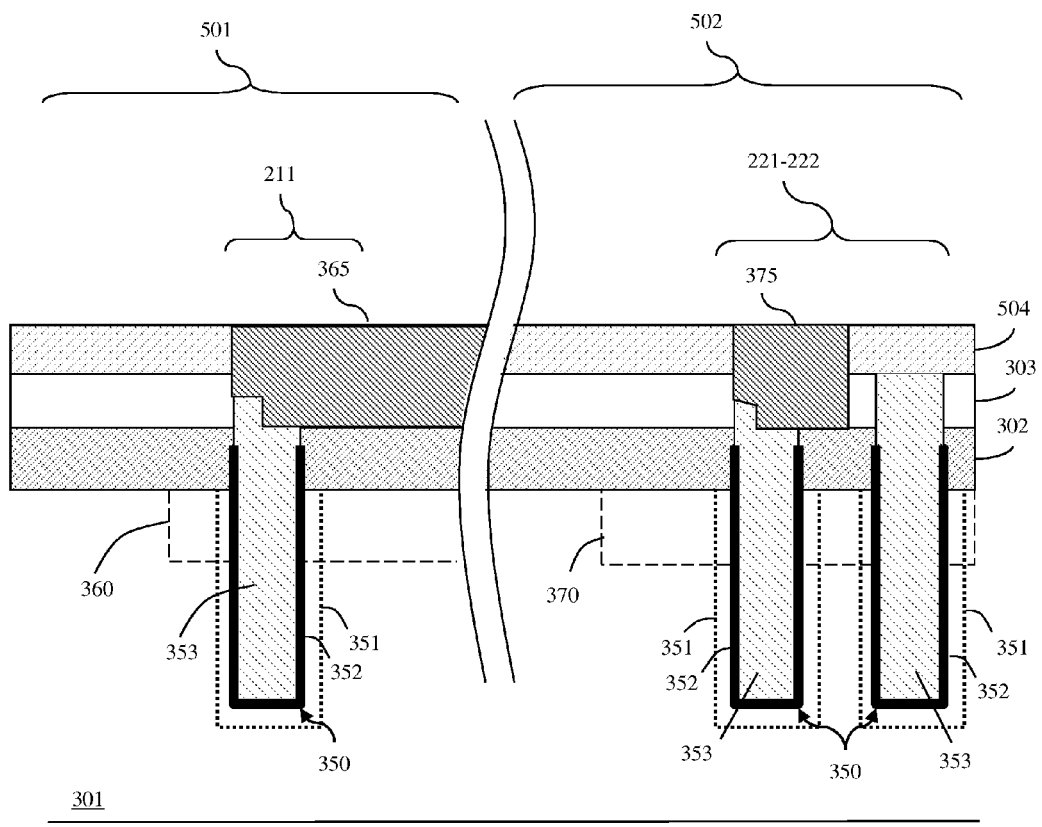
FIG. 8 is a cross-section diagram illustrating partially memory and reference cells formed according to the method of FIG. 4.

After the trench capacitors for the memory cell capacitor 211 and two reference cell capacitors 221-222 are formed, first and second doped regions 360, 370 are formed in the substrate 301 (412, see FIG. 8). Specifically, a first doped region 360 is formed such that it is in contact with the buried capacitor plate 351 of the memory cell capacitor 211 and a second doped region 370 is formed such that it extends between and electrically merges the buried capacitor plates 351 of the two reference cell capacitors 221-222. The first doped region 360 is used to extend the buried capacitor plate 351 of the memory cell capacitor 211 for contact, whereas the second doped region 370 electrically connects the two reference cell capacitors 221-222 in series. The first and second doped regions 360-370 can be formed simultaneously using a masked ion implantation process during which band regions 360, 370 at the top surface of the substrate 301 are heavily doped with the same or a different N-type dopant as the buried capacitor plates 351. It should be noted that the pad layer 504 can be formed prior to or after forming the doped regions 360, 370 at process 412.

Figure 9:
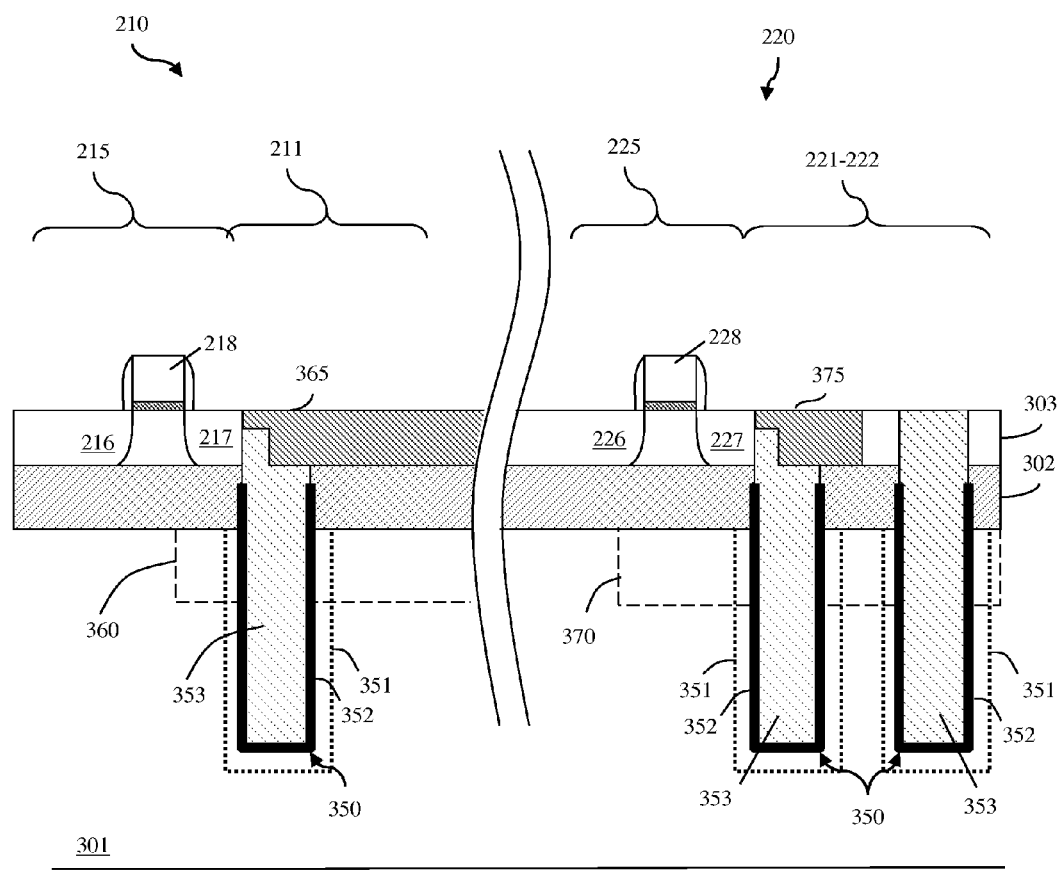
FIG. 9 is a cross-section diagram illustrating partially memory and reference cells formed according to the method of FIG. 4.

Next, a memory cell transistor 215 for the memory cell and a reference cell transistor 225 for the reference cell are formed (414, see FIG. 9). Specifically, using conventional field effect transistor (FET) processing techniques transistors 215, 225 are formed in the wafer sections 501, 502, respectively, such that in the semiconductor layer 303 a first source region 217 of the memory cell transistor 215 is in contact with the additional capacitor plate 353 of the memory cell capacitor 211 and a second source region 227 of the reference cell transistor 225 is in contact with the additional capacitor plate 353 of one of the two reference cell capacitors (i.e., the first reference cell capacitor 221).

Then, contacts (e.g., 283, 293, 361, 284, 294, and 372) are formed so as to allow an electrical connection between a first drain region 216 of the memory cell transistor 215 and a first bit line 281, between a first gate 218 of the memory cell transistor and a first word line 291, between the first doped region 360 and ground 250, between a second drain region 226 of the reference cell transistor 225 and a second bit line 282, between a second gate 228 of the reference cell transistor 225 and a second word line 292 and between an additional capacitor plate 353 of another one of the two reference cell capacitors (i.e., the second reference cell capacitor 222) and ground 250 (416, see FIGS. 2 and 3 in combination). It should be noted that since contacts 283, 293, 284 294 and 372 are to features at or above the semiconductor layer 303, they can be formed within the interlayer dielectric 304 simultaneously using conventional processing techniques for the contact formation. However, since contact 361 extends to the first doped region 360 within the semiconductor substrate 301, a multi-step process can be used to form the contact such that it comprises an upper portion 363 and a lower portion 364 below the upper portion 363. Specifically, the lower portion 364 can be formed first by lithographically patterning and etching a trench that extends through the insulator layer 302 into the substrate 301. Next, this trench can be filled with a conductor. For example, it can be filled with a polysilicon material and either in-situ doped or implanted with the same or a different N-type dopant as used in the formation of the doped region 360. The upper portion 363 of the contact 261 can then be formed simultaneously with the above-mentioned contacts.

Prior to forming the doped regions and the memory and reference cell transistors at processes 412-414, shallow trench isolation (STI) regions 365, 375 can be formed in the semiconductor layer 303 so that the subsequently formed first source region 217 of the memory cell transistor 215 will be electrically isolated from all other features of the memory cell capacitor 211 (i.e., all features other than the additional capacitor plate of the memory cell capacitor) and such that the subsequently formed second source region 227 of the reference cell transistor 225 is electrically isolated from all other features of the two reference cell capacitors 221-222 (i.e., all features other than the additional capacitor plate of the first one of the two reference cell capacitors) (410, see FIG. 8). Specifically, the memory cell STI region 365 can be patterned and formed, using conventional processing techniques, so that within the semiconductor layer 303 one side of the additional capacitor layer 353 of the memory cell capacitor 211 is in contact with the first source region 217 of the memory cell transistor 215 and so that the top surface and opposite side of the additional capacitor layer 353 of the memory cell capacitor 211 are bordered by trench isolation material. Thus, the first source region 217 of the memory cell transistor 215 and the additional capacitor plate 353 of the memory cell capacitor 211 will be electrically isolated from the subsequently formed first contact 361 and, thereby from ground 250. Similarly, the reference cell STI region 375 can be patterned and formed, using conventional processing techniques, so that within the semiconductor layer 303 one side of the additional capacitor layer 353 of the first reference cell capacitor 221 is in contact with the second source region 227 of the reference cell transistor 225 and the top surface and opposite side of the additional capacitor layer 353 of the first reference cell capacitor 221 are bordered by trench isolation material. The reference cell STI 375 should be formed such that the additional capacitor plate 353 of the second reference cell capacitor 222 continues to extend vertically to the top surface of the semiconductor layer 303, where it can be electrically connected by the second contact 372 to a reference plate 260 charged to ground or VDD, as necessary. Thus, the second source region 227 of the reference cell transistor 225 and the additional capacitor layer 353 of the first reference cell capacitor 221 will be electrically isolated from the subsequently formed second contact 372 and, thereby from the reference plate 260.

Figure 10:
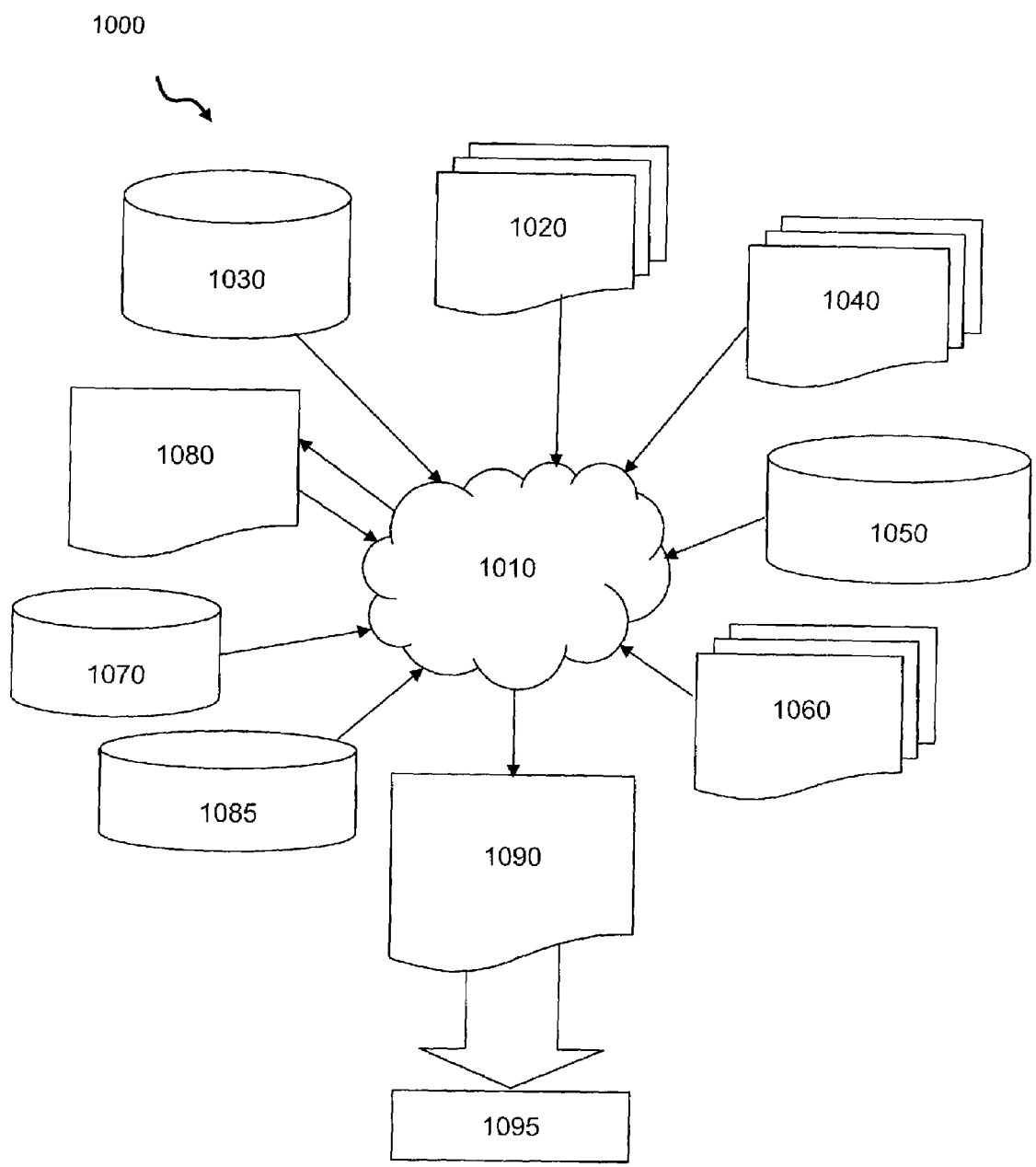
FIG. 10 is a block diagram illustrating an exemplary design flow process that can be used for designing, manufacturing and/or testing the circuit embodiments of the present invention.

Also disclosed are embodiments of a design structure embodied in a machine readable medium and comprising the memory circuit describe in detail above. FIG. 10 shows a block diagram of an exemplary design flow 1000 used for example, in semiconductor design, manufacturing, and/or test. Design flow 1000 may vary depending on the type of IC being designed. For example, a design flow 1000 for building an application specific IC (ASIC) may differ from a design flow 1000 for designing a standard component. Design structure 1020 is preferably an input to a design process 1010 and may come from an IP provider, a core developer, or other design company or may be generated by the operator of the design flow, or from other sources. Design structure 1020 comprises an embodiment of the invention, as shown in FIGS. 2-3, in the form of schematics or HDL, a hardware-description language (e.g., Verilog, VHDL, C, etc.). Design structure 1020 may be contained on one or more machine readable medium. For example, design structure 1020 may be a text file or a graphical representation of an embodiment of the invention, as shown in FIGS. 2-3. Design process 1010 preferably synthesizes (or translates) an embodiment of the invention, as shown in FIGS. 2-3 into a netlist 1080, where netlist 1080 is, for example, a list of wires, transistors, logic gates, control circuits, I/O, models, etc. that describes the connections to other elements and circuits in an integrated circuit design and recorded on at least one of machine readable medium. This may be an iterative process in which netlist 1080 is resynthesized one or more times depending on design specifications and parameters for the circuit.

Design process 1010 may include using a variety of inputs; for example, inputs from library elements 1030 which may house a set of commonly used elements, circuits, and devices, including models, layouts, and symbolic representations, for a given manufacturing technology (e.g., different technology nodes, 32 nm, 45 nm, 90 nm, etc.), design specifications 1040, characterization data 1050, verification data 1060, design rules 1070, and test data files 1085 (which may include test patterns and other testing information). Design process 1010 may further include, for example, standard circuit design processes such as timing analysis, verification, design rule checking, place and route operations, etc. One of ordinary skill in the art of integrated circuit design can appreciate the extent of possible electronic design automation tools and applications used in design process 1010 without deviating from the scope and spirit of the invention. The design structure of the invention is not limited to any specific design flow.

Design process 1010 preferably translates an embodiment of the invention, as shown in FIGS. 2-3, along with any additional integrated circuit design or data (if applicable), into a second design structure 1090. Design structure 1090 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 1090 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention, as shown in FIGS. 2-3. Design structure 1090 may then proceed to a stage 1095 where, for example, design structure 1090: proceeds to tape-out, is released to manufacturing, is released to a mask house, is sent to another design house, is sent back to the customer, etc.

Therefore, disclosed above are embodiments of a DRAM circuit that incorporates an improved reference cell, which has half the capacitance of the memory cell, which does not require a particular reference voltage, and which can be formed using the same fabrication processes as the memory cell. Specifically, the DRAM circuit embodiments of the present invention comprise a memory cell with a single trench capacitor and further comprise a reference cell having two trench capacitors. The two reference cell trench capacitors are connected in series through a merged buried capacitor plate such that they provide half the capacitance of the memory cell trench capacitor. Additionally, the reference cell trench capacitors have essentially the same structure as the memory cell trench capacitor and, thus, can be formed in conjunction with the memory cell trench capacitor. Also disclosed herein are embodiments of a design structure for the above-described memory circuit and a method for forming the above-described memory circuit.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the invention has been described in terms of embodiments, those skilled in the art will recognize that these embodiments of can be practiced with modification within the spirit and scope of the appended claims.

What is claimed is:

1. A memory circuit comprising:
    a memory cell comprising: a memory cell capacitor electrically connected to ground and a memory cell transistor,
    wherein said memory cell capacitor exhibits a first capacitance, and
    wherein said memory cell transistor is adapted to electrically connect said memory cell capacitor to a first bit line when a first word line is active;
    a reference cell comprising: two reference cell capacitors connected in series and electrically connected to a reference plate and a reference cell transistor,
    wherein said two reference cell capacitors connected in series exhibit a second capacitance that is approximately one half said first capacitance,
    wherein said reference cell transistor is adapted to electrically connect said two reference cell capacitors connected in series to a second bit line when a second word line is active, and
    wherein said reference plate is adapted to apply a first voltage to said reference cell capacitors, when said first word line and said second word line are inactive, and further to apply a second voltage level different from said first voltage level to said two reference cell capacitors, when said first word line is active;
    a precharge circuit adapted to precharge said first bit line and said second bit line to said first voltage level, when said first word line and said second word line are inactive; and
    a sense amplifier adapted to detect a potential difference between said first bit line and said second bit line, during a read operation, when said first word line and said second word line are active.

2. The memory circuit according to claim 1, all the limitations of which are incorporated by reference, wherein said memory cell capacitor and said two reference cell capacitors connected in series comprise substantially identical capacitor structures.

3. The memory circuit according to claim 1, all the limitations of which are incorporated by reference, wherein said memory cell capacitor and said two reference cell capacitors connected in series comprise substantially identical trench capacitors and wherein each of said substantially identical trench capacitors comprises:
    a trench through a semiconductor layer, an insulator layer and into a semiconductor substrate;
    a buried capacitor plate within said semiconductor substrate adjacent said trench;
    a capacitor dielectric layer lining said trench; and
    an additional capacitor plate on said capacitor dielectric layer within said trench.

4. The memory circuit according to claim 3, all the limitations of which are incorporated by reference,
    wherein said memory cell transistor further comprises a first drain region electrically connected to said first bit line, a first gate electrically connected to said first word line, and a first source region electrically connected to said additional capacitor plate of said memory cell capacitor, and
    wherein said memory circuit further comprises:
    a first doped region within said semiconductor substrate and in contact with said buried capacitor plate of said memory cell capacitor; and
    a first contact to said first doped region so as to allow said buried capacitor plate of said memory cell capacitor to be electrically connected to ground.

5. The memory circuit according to claim 4, all the limitations of which are incorporated by reference, further comprising a second doped region in said semiconductor substrate and extending between buried capacitor plates of said two reference cell capacitors so as to electrically connect said two reference cell capacitors in series.

6. The memory circuit according to claim 5, all the limitations of which are incorporated by reference,
    wherein said reference cell transistor comprises a second drain region electrically connected to said second bit line, a second gate electrically connected to said second word line, and a second source region electrically connected to said additional capacitor plate of a first one of said two reference cell capacitors, and
    wherein said memory circuit further comprises a second contact to said additional capacitor plate of a second one of said two reference cell capacitors so as to electrically connect said two reference cell capacitors connected in series to said reference plate.

7. The memory circuit according to claim 6, all the limitations of which are incorporated by reference, further comprising shallow trench isolation regions configured to electrically isolate said first source region from all other features of said memory cell capacitor and further to electrically isolate said second source region from all other features of said two reference cell capacitors connected in series.

8. The memory circuit according to claim 6, all the limitations of which are incorporated by reference, wherein said first voltage level comprises a ground level and said second voltage level comprises VDD and wherein, during said read operation, said reference plate swings from said ground level to said VDD so as to transfer ½ charge to said second bit line for reference.

9. A method of forming a memory cell and reference cell for incorporation into a memory circuit, said method comprising:
    providing a wafer; and
    forming on said wafer a memory cell capacitor for said memory cell and two reference cell capacitors connected in series for said reference cell such that said memory cell capacitor and said two reference cell capacitors comprise substantially identical capacitor structures and such that said memory cell capacitor exhibits a first capacitance and said two reference cell capacitors connected in series exhibit a second capacitance that is approximately one half said first capacitance.

10. The method according to claim 9, all the limitations of which are incorporated by reference, wherein said providing of said wafer comprises providing a wafer with a semiconductor substrate, an insulator layer on said semiconductor substrate, and a semiconductor layer on said insulator layer, and wherein said forming of said memory cell capacitor and said two reference cell capacitors connected in series further comprises:

forming trenches through said semiconductor layer and said insulator layer into said semiconductor substrate;

forming buried capacitor plates within said semiconductor substrate bordering said trenches;

forming capacitor dielectric layers lining said trenches; and forming additional capacitor plates within said trenches on said capacitor dielectric layers.

11. The method according to claim 10, all the limitations of which are incorporated by reference, wherein said forming of said buried capacitor plates comprises performing one of a plasma doping process, a gas phase doping process, and an ion implantation process.

12. The method according to claim 10, all the limitations of which are incorporated by reference, wherein said forming of said capacitor dielectric layers comprises depositing at least one of an oxide material, a nitride material, an oxynitride material, and a high-k dielectric material.

13. The method according to claim 10, all the limitations of which are incorporated by reference, wherein said forming of said additional capacitor plates comprises depositing a polysilicon material.

14. The method according to claim 10, all the limitations of which are incorporated by reference, further comprising forming in said semiconductor substrate a first doped region in contact with a buried capacitor plate of said memory cell capacitor and a second doped region extending between buried capacitor plates of said two reference cell capacitors, wherein said second doped region electrically connects said two reference cell capacitors in series.

15. The method according to claim 14, all the limitations of which are incorporated by reference, further comprising forming a memory cell transistor for said memory cell and a reference cell transistor for said reference cell in said semiconductor layer such that a first source region of said memory cell transistor is in contact with an additional capacitor plate of said memory cell capacitor and such that a second source region of said reference cell transistor is in contact with an additional capacitor plate of one of said two reference cell capacitors.

16. The method according to claim 15, all the limitations of which are incorporated by reference, further comprising forming contacts so as to allow electrical connections between a first drain region of said memory cell transistor and a first bit line, between a first gate of said memory cell transistor and a first word line, between said first doped region and ground, between a second drain region of said reference cell transistor and a second bit line, between a second gate of said reference cell transistor and a second word line and between an additional capacitor plate of another one of said two reference cell capacitors and a reference plate.

17. The method according to claim 15, all the limitations of which are incorporated by reference, further comprising forming in said semiconductor layer shallow trench isolation regions such that said first source region of said memory cell transistor is electrically isolated from all other features of said memory cell capacitor and such that said second source region of said reference cell transistor is electrically isolated from all other features of said two reference cell capacitors.

18. A design structure embodied in a machine readable medium, said design structure comprising a memory circuit comprising:

a memory cell comprising: a memory cell capacitor electrically connected to ground and a memory cell transistor, wherein said memory cell capacitor exhibits a first capacitance, and wherein said memory cell transistor is adapted to electrically connect said memory cell capacitor to a first bit line, when a first word line is active;

a reference cell comprising: two reference cell capacitors connected in series and electrically connected to a reference plate and a reference cell transistor, wherein said two reference cell capacitors connected in series exhibit a second capacitance that is approximately one half said first capacitance, wherein said reference cell transistor is adapted to electrically connect said two reference cell capacitors connected in series to a second bit line, when a second word line is active, and wherein said reference plate is adapted to apply a first voltage to said reference cell capacitors, when said first word line and said second word line are inactive, and further to apply a second voltage level different from said first voltage level to said two reference cell capacitors, when said first word line is active;

a precharge circuit adapted to precharge said first bit line and said second bit line to said first voltage level, when said first word line and said second word line are inactive; and a sense amplifier adapted to detect a potential difference between said first bit line and said second bit line, during a read operation, when said first word line and said second word line are active.

19. The design structure according to claim 18, all the limitations of which are incorporated by reference, wherein said design structure comprises a netlist.

20. The design structure according to claim 18, all the limitations of which are incorporated by reference, wherein said design structure resides on storage medium as a data format used for the exchange of layout data of integrated circuits.

* * * * *